US009691667B2

(12) United States Patent
Huang et al.

(10) Patent No.: US 9,691,667 B2
(45) Date of Patent: Jun. 27, 2017

(54) INTEGRATED CIRCUIT AND MANUFACTURING METHOD THEREOF

(71) Applicant: SEMICONDUCTOR MANUFACTURING INTERNATIONAL (SHANGHAI) CORPORATION, Shanghai (CN)

(72) Inventors: Herb He Huang, Shanghai (CN); Clifford Ian Drowley, Shanghai (CN)

(73) Assignee: Semiconductor Manufacturing International Corporation (Shanghai) (CN)

( * ) Notice: Subject to any disclaimer, the term of this patent is extended or adjusted under 35 U.S.C. 154(b) by 0 days.

(21) Appl. No.: 14/597,126

(22) Filed: Jan. 14, 2015

(65) Prior Publication Data
US 2015/0214296 A1    Jul. 30, 2015

(30) Foreign Application Priority Data

Jan. 26, 2014  (CN) .......................... 2014 1 0037719

(51) Int. Cl.
| | | |
|---|---|---|
| *H01L 21/70* | (2006.01) | |
| *H01L 21/84* | (2006.01) | |
| *H01L 27/12* | (2006.01) | |
| *H01L 29/78* | (2006.01) | |
| H01L 21/768 | (2006.01) | |
| H01L 21/762 | (2006.01) | |
| H01L 21/764 | (2006.01) | |
| H01L 29/66 | (2006.01) | |

(52) U.S. Cl.
CPC .......... *H01L 21/84* (2013.01); *H01L 27/1203* (2013.01); *H01L 29/7833* (2013.01); *H01L 21/764* (2013.01); *H01L 21/7682* (2013.01); *H01L 21/76264* (2013.01); *H01L 21/76289* (2013.01); *H01L 29/66575* (2013.01)

(58) Field of Classification Search
CPC . H01L 21/84; H01L 29/7833; H01L 27/1203; H01L 29/66575; H01L 21/76264; H01L 21/76289; H01L 21/764; H01L 21/7682; H01L 23/4821; H01L 29/0649; H01L 29/4991
See application file for complete search history.

(56) References Cited

U.S. PATENT DOCUMENTS

| | | | |
|---|---|---|---|
| 2002/0090837 A1* | 7/2002 | Chung ................. | H01L 23/485 438/586 |
| 2008/0217693 A1* | 9/2008 | Wang .................. | H01L 29/1083 257/352 |

(Continued)

*Primary Examiner* — Su C Kim
(74) *Attorney, Agent, or Firm* — Innovation Counsel LLP

(57) ABSTRACT

An integrated circuit includes a semiconductor substrate, and at least two transistors connected in series on the semiconductor substrate, wherein each transistor shares a source electrode or a drain electrode with an adjacent transistor. The integrated circuit also includes a hermetic cavity disposed on the source electrode and the drain electrode, between gate electrodes of adjacent transistors. The source electrode disposed at a first end portion of the series of transistors is in direct contact with a source interconnect, and the drain electrode disposed at a second end portion of the series of transistors is in direct contact with a drain interconnect.

16 Claims, 7 Drawing Sheets

(56) References Cited

U.S. PATENT DOCUMENTS

| | | | |
|---|---|---|---|
| 2012/0007151 A1* | 1/2012 | Yoshimori | H01L 21/26586 257/255 |
| 2012/0178235 A1* | 7/2012 | Pachamuthu | H01L 21/764 438/421 |
| 2012/0238099 A1* | 9/2012 | Shundo | H01L 21/7682 438/703 |

* cited by examiner

INTEGRATED CIRCUIT AND MANUFACTURING METHOD THEREOF

CROSS-REFERENCE TO RELATED APPLICATION

This application claims priority to Chinese Patent Application No. 201410037719.2 filed on Jan. 26, 2014, the disclosure of which is incorporated herein by reference in its entirety.

BACKGROUND

Technical Field

The present disclosure relates to the field of semiconductor technology, and more particularly to an integrated circuit and manufacturing method thereof.

Description of the Related Art

In the field of semiconductor technology, a radio frequency front-end module (herein referred to as RF FEM) is a key component in wireless communication devices such as mobile phones, tablet computers, etc. The RF FEM includes an integrated circuit comprising RF switches. High signal fidelity, low insertion loss, good linearity characteristics, and minimal signal distortion are generally desired in the integrated circuit including the RF switches.

To achieve the above characteristics, the RF switches in the prior art typically employ gallium arsenide (GaAs) semiconductor transistors. However, the use of GaAs often increases manufacturing and packaging costs.

In recent years, silicon-on-insulator metal oxide semiconductor (SOI MOS) field effect transistors have been used to replace GaAs semiconductor transistors in the RF switches. In particular, it is noted that the performance of the SOI MOS transistors is now nearly on par with that of GaAs semiconductor transistors.

However, the use of SOI MOS transistors as RF switches in the integrated circuit of the RF FEM poses certain challenges. For example, there may be increased parasitic capacitive coupling between the source electrode, drain electrode, gate electrode, interconnects, and semiconductor substrate, and it may be difficult to eliminate the increased parasitic capacitance. In addition, the parasitic capacitance may vary with changes in the voltage of the switching signal, which could affect the switching performance of the RF switches and impact the overall performance of the RF FEM.

SUMMARY

The present disclosure addresses at least the above issues in the prior art. Specifically, the present disclosure discloses an integrated circuit including a plurality of transistors connected in series and hermetic cavities disposed between the gate electrodes of adjacent transistors. A low dielectric can be obtained between the drain electrode and the gate electrode using the hermetic cavities. Accordingly, the parasitic coupling capacitance between the drain electrode and the gate electrode can be reduced, thereby improving the performance of the exemplary integrated circuit over the prior art.

According to one embodiment of the inventive concept, an integrated circuit is provided. The integrated circuit includes a semiconductor substrate, and at least two transistors connected in series on the semiconductor substrate, wherein each transistor shares a source electrode or a drain electrode with an adjacent transistor. The integrated circuit also includes a hermetic cavity disposed on the source electrode and the drain electrode, between gate electrodes of adjacent transistors. The source electrode disposed at a first end portion of the series of transistors is in direct contact with a source interconnect, and the drain electrode disposed at a second end portion of the series of transistors is in direct contact with a drain interconnect.

In one embodiment, a top portion of the hermetic cavity may be covered by an insulating cover layer including a plurality of through-holes. The through-holes may be sealed by a plurality of seal plugs so as to form the hermetic cavity.

In one embodiment, the source interconnect, the drain interconnect, and the seal plugs may be made of a same material.

In one embodiment, the source interconnect and the drain interconnect may be made of tungsten.

In one embodiment, the integrated circuit may further include a metal silicide disposed on top of the source electrode, the drain electrode, and the gate electrode.

In one embodiment, the semiconductor substrate may be a monocrystalline silicon substrate.

In one embodiment, the semiconductor substrate may be a silicon-on-insulator (SOI) substrate comprising a buried insulating layer, a first substrate disposed above the buried insulating layer, and a second substrate disposed below the buried insulating layer.

In one embodiment, bottom portions of the transistors may be spaced apart from the buried insulating layer by a predetermined distance.

In one embodiment, the first substrate and the second substrate may be made of single crystal silicon, and the buried insulating layer may be made of a silicon-containing dielectric material.

In one embodiment, the buried insulating layer may include at least one of silicon oxide and silicon nitride.

In one embodiment, the semiconductor substrate may further include a bottom dielectric layer.

According to another embodiment of the inventive concept, a method of manufacturing an integrated circuit is provided. The method includes: providing a semiconductor substrate; forming at least two transistors connected in series on the semiconductor substrate, wherein each transistor shares a source electrode or a drain electrode with an adjacent transistor; forming a sacrificial gate dielectric layer on the source electrode and the drain electrode between adjacent transistors; forming an insulating cover layer on the semiconductor substrate covering the sacrificial gate dielectric layer, the gate electrode, the source electrode at a first end portion of the series of transistors, and the drain electrode at a second end portion of the series of transistors; forming a plurality of through-holes in the insulating cover layer above the sacrificial gate dielectric layer; removing the sacrificial gate dielectric layer via the through-holes so as to form a cavity; forming a plurality of seal plugs sealing the through-holes so as to form a hermetic cavity; and forming a source interconnect extending through the insulating cover layer so as to directly contact the source electrode at the first end portion of the series of transistors, and a drain interconnect extending through the insulating cover layer so as to direct contact the drain electrode at the second end portion of the series of transistors.

In one embodiment, after the at least two transistors have been formed and prior to forming the sacrificial gate dielectric layer, the method may further include: forming a metal silicide on top of the source electrode, the drain electrode, and the gate electrode.

In one embodiment, the source interconnect, the drain interconnect, and the seal plugs may be made of a same material.

According to a further embodiment of the inventive concept, a method of manufacturing an integrated circuit is provided. The method includes: providing a semiconductor substrate; forming at least two transistors connected in series on the semiconductor substrate, wherein each transistor shares a source electrode or a drain electrode with an adjacent transistor; forming a sacrificial gate dielectric layer on the source electrode and the drain electrode between adjacent transistors; forming an insulating cover layer on the semiconductor substrate covering the sacrificial gate dielectric layer, the gate electrode, the source electrode at a first end portion of the series of transistors, and the drain electrode at a second end portion of the series of transistors; forming a plurality of through-holes in the insulating cover layer above the sacrificial gate dielectric layer, and forming a first via extending through the insulating cover layer to the source electrode at the first end portion of the series of transistors, and a second via extending through the insulating cover layer to the drain electrode at the second end portion of the series of transistors; removing the sacrificial gate dielectric layer via the through-holes so as to form a cavity; and forming a plurality of seal plugs sealing the through-holes so as to form a hermetic cavity, and forming a source interconnect in the first via so as to directly contact the source electrode at the first end portion of the series of transistors, and a drain interconnect in the second via so as to directly contact the drain electrode at the second end portion of the series of transistors.

In one embodiment, after the at least two transistors have been formed and prior to forming the sacrificial gate dielectric layer, the method may further include: forming a metal silicide on top of the source electrode, the drain electrode, and the gate electrode.

In one embodiment, the source interconnect, the drain interconnect, and the seal plugs may be made of a same material.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

It is noted that in the accompanying drawings, for convenience of description, the dimensions of the components shown may not be drawn to scale. Also, same or similar reference numbers between different drawings represent the same or similar components.

DETAILED DESCRIPTION

Figure 1A:
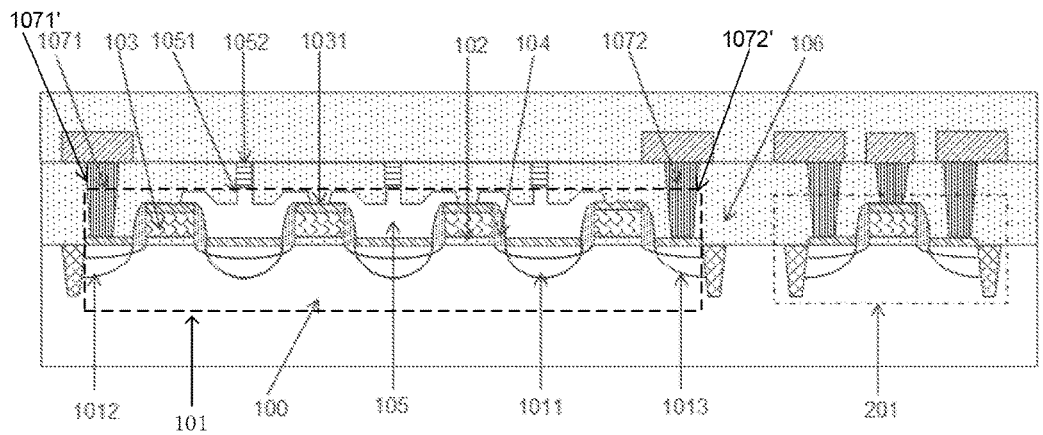
FIG. 1A depicts a schematic cross-sectional view of an integrated circuit according to an embodiment.

Various embodiments of the inventive concept are next described in detail with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments do not limit the scope of the inventive concept unless otherwise specifically stated. In addition, techniques, methods, and devices as known by those skilled in the art, although omitted in some instances, are intended to be part of the specification where appropriate. It should be noted that for convenience of description, the sizes of the elements in the drawings may not be drawn to scale.

In the drawings, the sizes and/or relative sizes of layers and regions may be exaggerated for clarity. Like reference numerals denote the same elements throughout.

It should be understood that when an element or layer is referred to as "in", "adjacent to", "connected to", or "coupled to" another element or layer, it can be directly on the other element or layer, adjacent, connected or coupled to the other element or layer. In some instances, one or more intervening elements or layers may be present. In contrast, when an element is referred to as being "directly on", "directly adjacent to", "directly connected to", or "directly coupled to" another element or layer, there are no intervening elements present or layer. It will be understood that, although the terms "first," "second," "third," etc. may be used herein to describe various elements, the elements should not be limited by those terms. Instead, those terms are merely used to distinguish one element from another. Thus, a "first" element discussed below could be termed a "second" element without departing from the teachings of the present inventive concept. As used herein, the term "and/or" includes any and all combinations of one or more of the associated listed items.

Spatially relative terms, such as "beneath", "below", "lower", "above", "upper" and the like, may be used herein for ease of description to describe one element or feature's spatial relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to limit the inventive concept. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art, and should not be interpreted in an idealized or overly formal sense unless expressly so defined herein.

Exemplary embodiments are described herein with reference to cross-sectional illustrations that are schematic illustrations of idealized exemplary embodiments (and intermediate structures) of the inventive concept. As such, variations from the shapes of the illustrations as a result of, for example, manufacturing techniques and/or tolerances, are to be expected. Thus, the exemplary embodiments should not be construed as being limited to the particular shapes of regions illustrated herein, but may also include deviations in shapes that result, for example, from manufacturing tolerances. The regions illustrated in the figures are schematic in nature, and their shapes are not intended to illustrate the actual shape of a region of a device, and should not be construed to limit the scope of the inventive concept.

It should be understood that the inventive concept is not limited to the embodiments described herein. Rather, the inventive concept may be modified in different ways to realize different embodiments.

The integrated circuit according to an embodiment may include an integrated circuit consisting of RF switches. However, the inventive concept is not limited thereto. In another embodiment, the integrated circuit may include an integrated circuit comprising RF switches and other components. The integrated circuit may also include various types of integrated circuits.

In one embodiment, the integrated circuit includes a plurality of transistors connected in series. A hermetic cavity (e.g. a microvacuum chamber) is disposed between the gate electrodes of adjacent transistors, so as to obtain a low dielectric constant between the drain electrode and gate electrode. By lowering the dielectric constant, the parasitic capacitive coupling between the drain electrode and gate electrode is reduced, thereby improving the performance of the integrated circuit. As such, the transistors connected in series can be used to improve the performance of a RF switching device.

FIG. 1A depicts a schematic cross-sectional view of an integrated circuit according to an embodiment.

Referring to FIG. 1A, the integrated circuit includes a semiconductor substrate 100 and at least two transistors 101 connected in series on the semiconductor substrate 100. In the embodiment of FIG. 1A, four transistors 101 are shown connected in series. Each transistor 101 shares a source/drain electrode 1011 with an adjacent transistor 101. A hermetic cavity 105 is disposed on the source/drain electrode 1011. Specifically, the hermetic cavity 105 is disposed between gate electrodes 103 of adjacent transistors 101.

As shown FIG. 1A, a source electrode 1012 is disposed at a first end portion of the series of transistors 101, and is in direct contact with a source interconnect 1071. A drain electrode 1013 is disposed at a second end portion of the series of transistors 101, and is in direct contact with a drain interconnect 1072.

The top of the hermetic cavity 105 is covered by an insulating cover layer 106. The insulating cover layer 106 includes a plurality of through-holes 1051 disposed on the top of the hermetic cavity 105. The through-holes 1051 are sealed by seal plugs 1052, as shown in FIG. 1A.

The interior of the hermetic cavity 105 may be in a high vacuum state. In another embodiment, the interior of the hermetic cavity 105 may be in a low vacuum state. In an alternative embodiment, the interior of the hermetic cavity 105 may be filled with a gas. Since the dielectric constant of the hermetic cavity 105 is lower than the dielectric constant of a conventional interlayer dielectric layer (e.g., the insulating cover layer 106), a low dielectric can be realized between the drain electrode (source/drain electrode 1011) and the gate electrode 103 using the hermetic cavity 105. Accordingly, the parasitic capacitive coupling between the drain electrode (source/drain electrode 1011) and the gate electrode 103 can be reduced, thereby improving the performance of the integrated circuit.

In one embodiment, the integrated circuit may further include a metal silicide 1031 disposed on top of the source/drain electrode 1011 and the gate electrode 103 (as shown in FIG. 1A).

In one embodiment, the at least two transistors 101 connected in series may be used in a RF switching device. The transistors 101 may include a metal oxide semiconductor field effect transistor (MOSFET) or other types of transistors. The transistors 101 may be formed in a strip or any other shape/configuration. Each transistor 101 further includes a gate insulating layer 102 and gate sidewalls 104, as shown in FIG. 1A. In addition to the transistors 101, the integrated circuit of FIG. 1A may further include a transistor 201, shallow trench isolation structures, and various other circuit components.

In one embodiment, the semiconductor substrate 100 may be a single crystal silicon substrate. In one embodiment, the semiconductor substrate 100 may further include a bottom dielectric layer so as to improve device performance.

The source interconnect 1071 and the drain interconnect 1072 are vertical interconnects connecting to the source electrode 1012 and the drain electrode 1013, respectively. In one embodiment, the vertical interconnects and the seal plugs 1052 may be made of a same material. In one embodiment, the vertical interconnects may be made of tungsten.

Figure 1B:
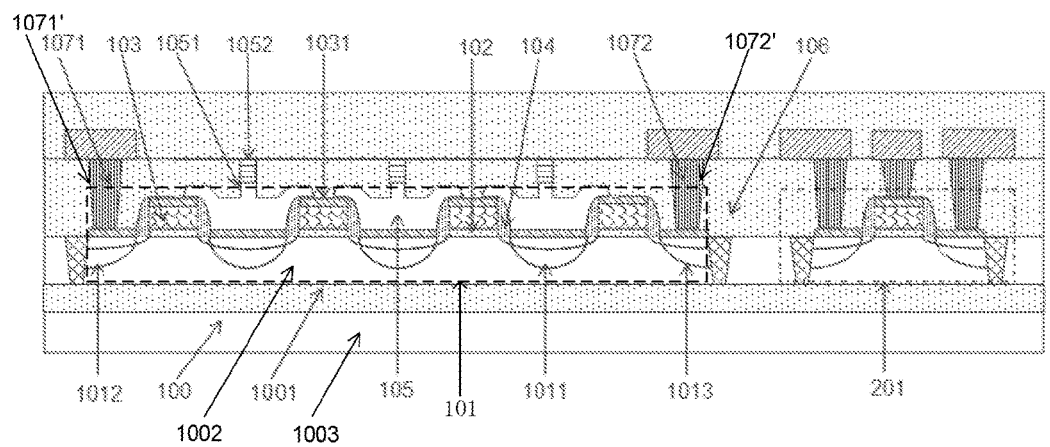
FIG. 1B depicts a schematic cross-sectional view of an integrated circuit according to another embodiment.

FIG. 1B depicts a schematic cross-sectional view of an integrated circuit according to another embodiment.

The embodiment of FIG. 1B is similar to the embodiment of FIG. 1A except for the semiconductor substrate 100.

In the example of FIG. 1B, the semiconductor substrate 100 is a silicon-on-insulator (SOI) substrate comprising a buried insulating layer 1001 (also known referred to as a bottom insulation layer), a first substrate 1002 disposed above the buried insulating layer 1001, and a second substrate 1003 disposed below the buried insulating layer 1001. The bottom portions of the transistors 101 are spaced apart from the buried insulating layer 1001 by a predetermined distance.

In the semiconductor substrate 100 of FIG. 1B, the first substrate and the second substrate are made of single crystal silicon, and the buried insulating layer 1001 is made of a silicon-containing dielectric material. For example, the buried insulating layer 1001 may include at least one of silicon oxide and silicon nitride.

The integrated circuit of FIG. 1B also includes a plurality of transistors connected in series and a hermetic cavity disposed between the gate electrodes of adjacent transistors. A low dielectric can be obtained between the drain electrode and the gate electrode using the hermetic cavity. Accordingly, the parasitic capacitive coupling between the drain electrode and the gate electrode can be reduced, thereby improving the performance of the integrated circuit.

Figure 2A:
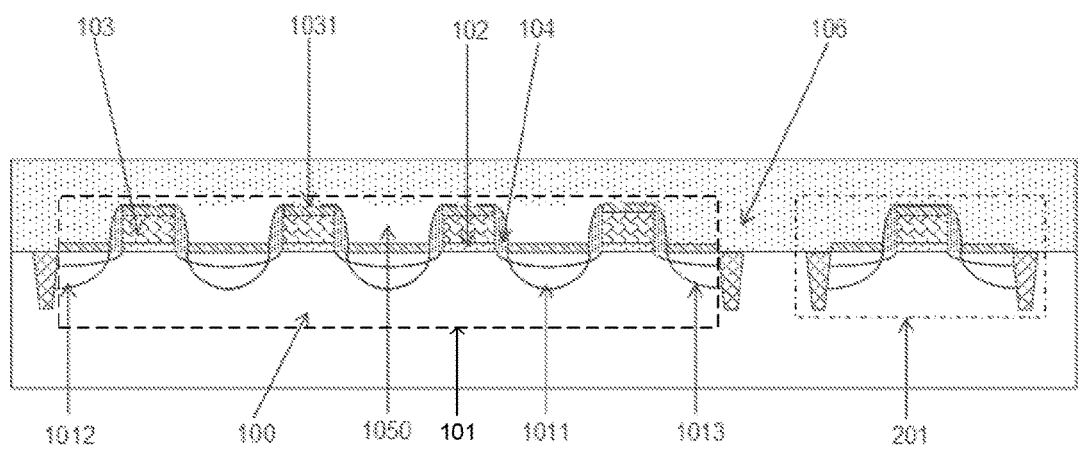
FIGS. 2A, 2B, 2C, and 2D depict cross-sectional views of the integrated circuit of FIG. 1 at different stages of manufacture.

Next, a method of manufacturing an integrated circuit according to an embodiment will be described in detail with reference to FIGS. 2A though 2D and FIG. 3. Specifically, FIGS. 2A, 2B, 2C, and 2D depict cross-sectional views of the integrated circuit of FIG. 1 at different stages of manufacture. FIG. 3 is a flowchart illustrating a method of manufacturing the integrated circuit of FIG. 1 according to an embodiment. The method includes the following steps:

In Step S101, a semiconductor substrate 100 is provided. At least two transistors 101 are formed connected in series on the semiconductor substrate 100. As shown in FIG. 2A, four transistors 101 are connected in series. Each transistor 101 shares a source/drain electrode 1011 with an adjacent transistor 101. A source electrode 1012 is formed at a first end portion of the series of transistors 101. A drain electrode 1013 is formed at a second end portion of the series of transistors 101.

In one embodiment, the semiconductor substrate 100 may be a conventional substrate (e.g. a silicon substrate). In another embodiment, the semiconductor substrate 100 may be a SOI substrate.

A gate insulating layer 102, a gate electrode 103, and gate sidewalls 104 are formed on the semiconductor substrate 100. The gate insulating layer 102, gate electrode 103, and gate sidewalls 104 constitute a gate structure for each transistor 101. As shown in FIG. 2A, each gate structure is formed between adjacent source/drain electrodes 1011.

In one embodiment, a metal silicide 1031 may be formed on top of the source/drain electrode 1011 and the gate electrode 103.

In Step S102, a sacrificial gate dielectric layer 1050 is formed on the source/drain electrodes 1011 between adjacent transistors 101 (specifically, between adjacent gate structures). The sacrificial gate dielectric layer 1050 may be formed in a strip or any other shape/configuration.

In Step S103, an insulating cover layer 106 is formed on the semiconductor substrate 100 covering the sacrificial gate dielectric layer 1050, the gate electrode 103, the source electrode 1012 at the first end portion of the series of transistors 101, and the drain electrode 1013 at the second end portion of the series of transistors 101.

The resulting structure after Steps A1 through A4 is illustrated in FIG. 2A. Specifically, the at least two transistors 101 connected in series and sharing source/drain electrodes 1011 are formed using Steps A1 and A2. However, the inventive concept is not limited thereto. For example, other transistors (e.g. transistor 201) may also be formed during Steps A1 and A2.

In Step S104, a plurality of through-holes 1051 are formed in the insulating cover layer 106 above the sacrificial gate dielectric layer 1050. The through-holes 1051 may be formed by etching or other appropriate methods.

In Step S105, the sacrificial gate dielectric layer 1050 is removed via the through-holes 1051 so as to form a cavity 105' with openings. The sacrificial gate dielectric layer 1050 may be removed using wet etching or other appropriate methods.

Figure 2B:
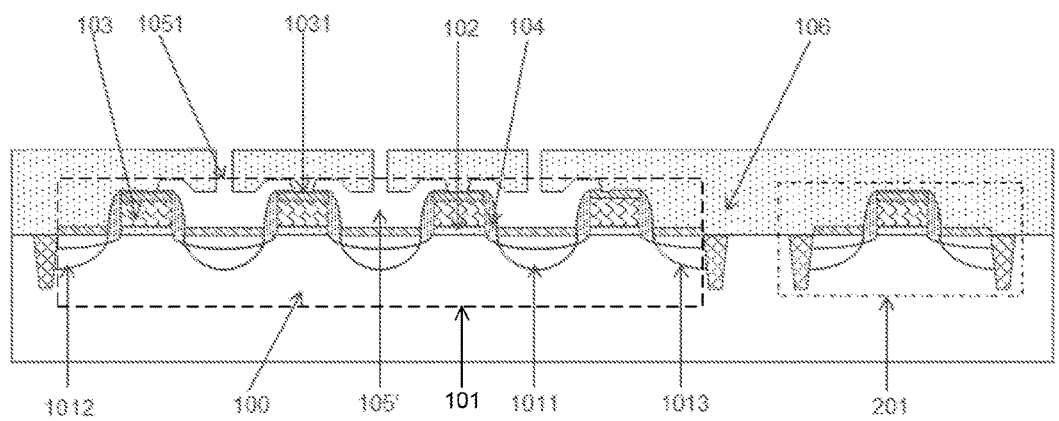
Figure 3:
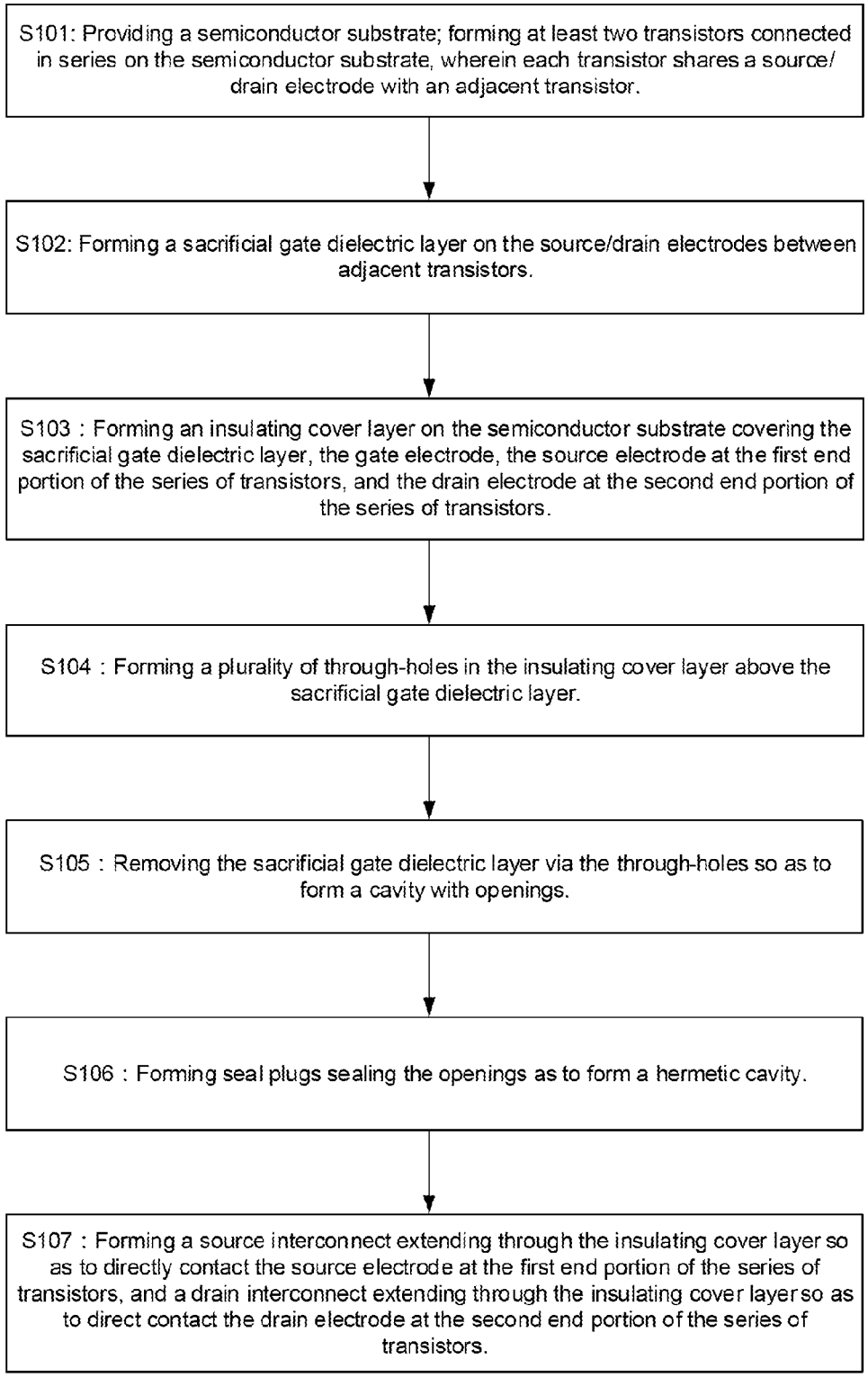
FIG. 3 is a flowchart illustrating a method of manufacturing the integrated circuit of FIG. 1 according to an embodiment.

The resulting structure after Steps S104 and S105 is illustrated in FIG. 2B.

In Step S106, seal plugs 1052 are formed sealing the through-holes 1051 so as to form a hermetic cavity 105. The seal plugs 1052 may be formed by filling the through-holes 1051 with a dielectric material and performing chemical mechanical polishing (CMP) on the dielectric material to planarize its top surface. The seal plugs 1052 may also be formed using other methods known to those skilled in the art.

Figure 2C:
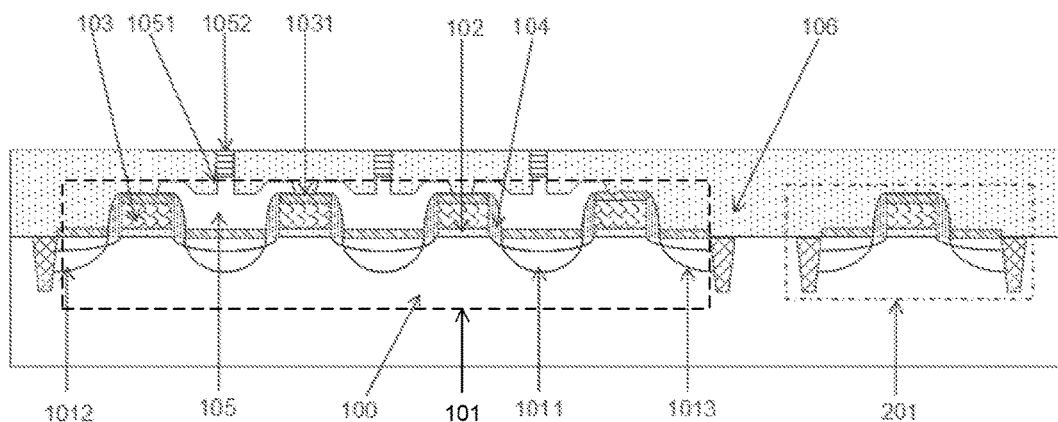

The resulting structure after Step S106 is illustrated in FIG. 2C.

In Step S107, a source interconnect 1071 is formed extending through the insulating cover layer 106 and directly contacts the source electrode 1012 at the first end portion of the series of transistors 101. A drain interconnect 1072 is also formed extending through the insulating cover layer 106 and directly contacts the drain electrode 1013 at the second end portion of the series of transistors 101.

Figure 2D:
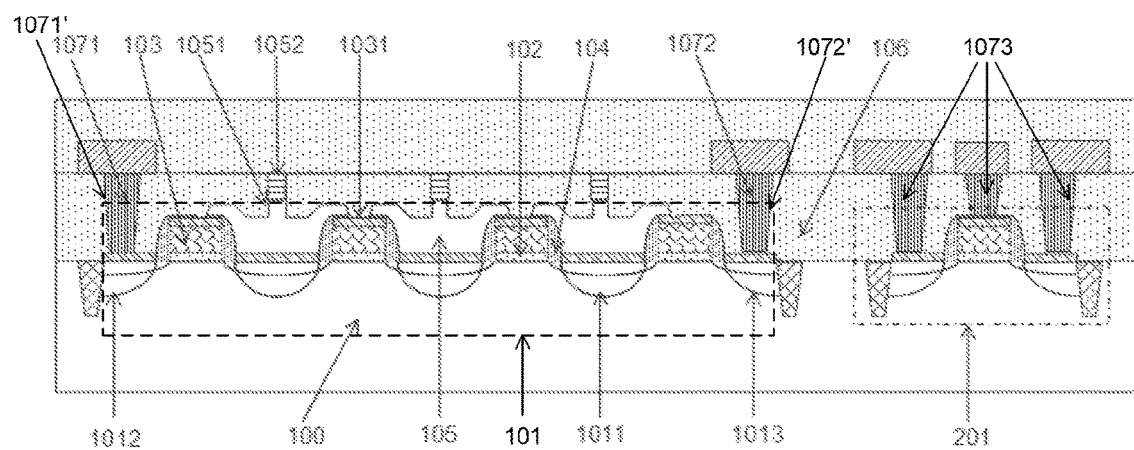

The resulting structure after Step S107 is illustrated in FIG. 2D.

The source interconnect 1071 and the drain interconnect 1072 are vertical interconnects connecting to the source electrode 1012 and the drain electrode 1013, respectively. The interconnects 1071/1072 may be formed by etching vias 1071'/1072' extending through the insulating cover layer 106 to the source/drain electrodes 1012/1013, filling the vias 1071'/1072' with a conductive material, and performing CMP to remove excess conductive material.

In addition, vertical interconnects 1073 for connecting to the transistor 201 may also be formed during Step S107, as shown in FIG. 2D.

Accordingly, an exemplary method of manufacturing an integrated circuit has been described above in Steps S101 through S107. However, the inventive concept is not limited to the above and may include additional semiconductor processing steps known to those skilled in the art. For example, in one embodiment, additional steps may be added after Step S107. The additional steps may include forming a dielectric layer to form resistors, inductors, and other passive components, forming microelectromechanical system (MEMS) devices, wafer dicing, packaging, etc. Since the additional steps are known to those skilled in the art, a detailed description of those steps will be omitted. It should be noted that the term "integrated circuit" as used herein may include fully finished integrated circuit products, partially finished integrated circuit products, individual integrated circuits, or a system of different integrated circuits.

Figure 4:
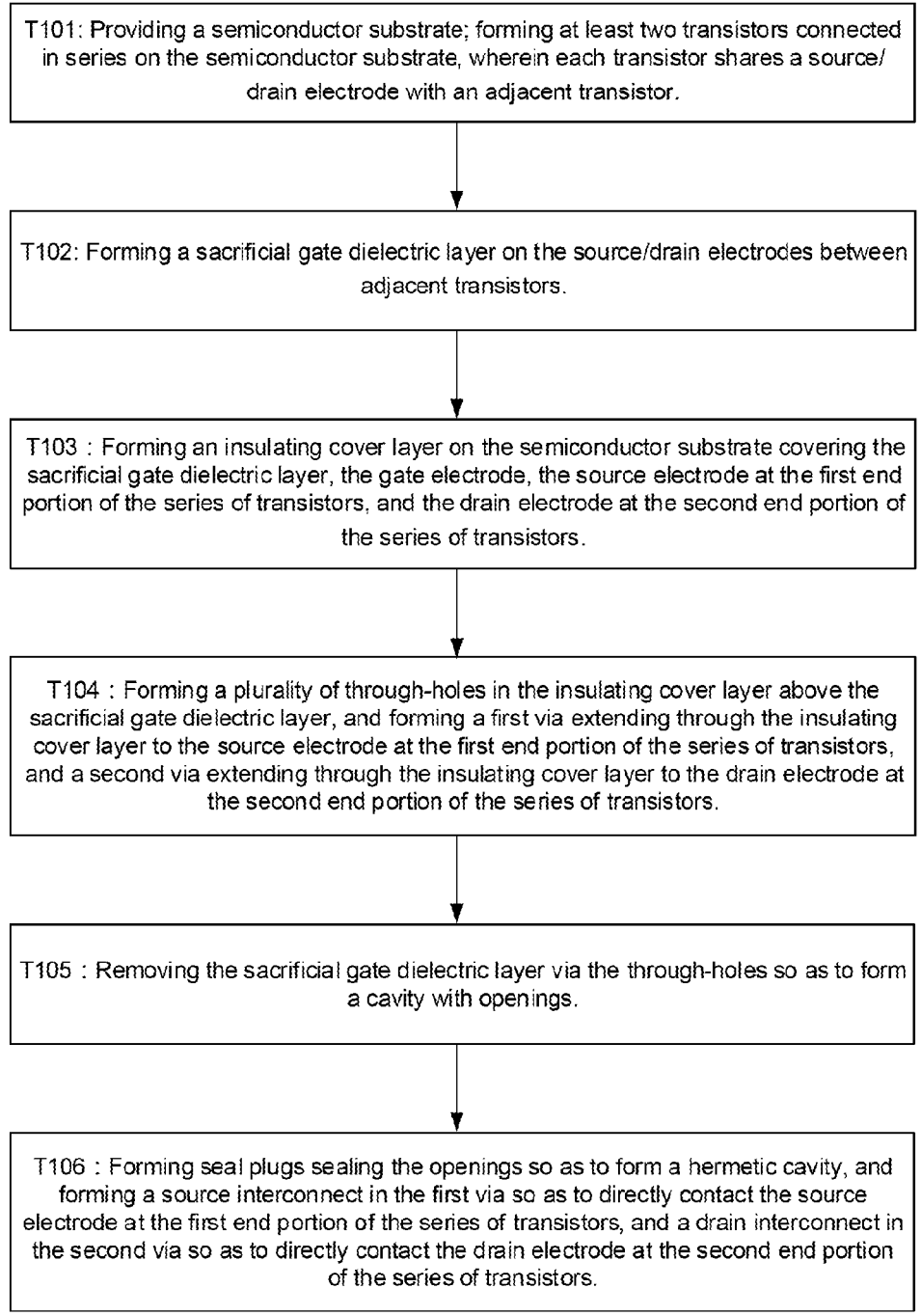
FIG. 4 is a flowchart illustrating a method of manufacturing the integrated circuit of FIG. 1 according to another embodiment.

FIG. 4 is a flowchart illustrating a method of manufacturing the integrated circuit of FIG. 1 according to another embodiment. The method of FIG. 4 is similar to the method of FIG. 3. Specifically, Steps T101 through T103 of FIG. 4 are the same as Steps S101 through S103 of FIG. 3. In the interest of brevity, a detailed description of T101 through T103 will not be repeated. Instead, the following description will focus on the differences between the methods in FIGS. 3 and 4.

In the method of FIG. 3, the source interconnect 1071 and drain interconnect 1072 are formed (Step S107) after the seal plugs 1052 have been formed (Step S106). In contrast, in the method of FIG. 4, the source interconnect 1071 and the drain interconnect 1072 are formed at the same time as the seal plugs 1052 (Step T106).

The method of FIG. 4 will be described starting from Step T104.

Referring to Step T104 in FIG. 4, a plurality of through-holes 1051 are formed in the insulating cover layer 106 above the sacrificial gate dielectric layer 1050. A first via 1071' is formed extending through the insulating cover layer 106 to the source electrode 1012 at the first end portion of the series of transistors 101. A second via 1072' is formed extending through the insulating cover layer 106 to the drain electrode 1013 at the second end portion of the series of transistors 101.

In Step T105, the sacrificial gate dielectric layer 1050 is removed via the through-holes 1051 as to form a cavity 105' with openings. The sacrificial gate dielectric layer 1050 may be removed using wet etching or other appropriate methods.

In Step T106, seal plugs 1052 are formed sealing the through-holes 1051 so as to form a hermetic cavity 105. The seal plugs 1052 may be formed by filling the through-holes 1051 with a dielectric material and performing chemical mechanical polishing (CMP) on the dielectric material to planarize its top surface. The seal plugs 1052 may also be formed using other methods known to those skilled in the art.

In addition, during Step T106, a source interconnect 1071 is formed in the first via 1071' and directly contacts the source electrode 1012 at the first end portion of the series of transistors 101. A drain interconnect 1072 is also formed in the second via 1072' and directly contacts the drain electrode 1013 at the second end portion of the series of transistors 101.

In one embodiment, an additional step (Step T1012) may be added after Step T101 and before Step T102. In Step T1012, a metal silicide 1031 is formed on top of the source/drain electrode 1011 and the gate electrode 103.

It should be noted that in the embodiment of FIG. 4, the semiconductor substrate 100 may be a conventional substrate (e.g. a silicon substrate). In another embodiment, the semiconductor substrate 100 may be a SOI substrate.

The integrated circuit formed using the exemplary methods of FIGS. 3 and 4 includes a plurality of transistors connected in series and a hermetic cavity disposed between the gate electrodes of adjacent transistors. A low dielectric can be obtained between the drain electrode and the gate electrode using the hermetic cavity. Accordingly, the parasitic capacitive coupling between the drain electrode and the gate electrode can be reduced, thereby improving the performance of the integrated circuit.

Embodiments of an integrated circuit and methods of manufacturing the integrated circuit have been described in the foregoing description. To avoid obscuring the inventive concept, details that are well-known in the art may have been omitted. Nevertheless, those skilled in the art would be able to understand the implementation of the inventive concept and its technical details in view of the present disclosure.

The different embodiments of the inventive concept have been described with reference to the accompanying drawings. However, the different embodiments are merely illustrative and are not intended to limit the scope of the inventive concept. Furthermore, those skilled in the art would appreciate that various modifications can be made to the different embodiments without departing from the scope of the inventive concept.

What is claimed is:

1. An integrated circuit comprising:
   a semiconductor substrate;
   at least two transistors connected in series on the semiconductor substrate, wherein each transistor shares a source electrode or a drain electrode with an adjacent transistor;
   a hermetic cavity disposed on the source electrode and the drain electrode, between gate electrodes of adjacent transistors;
   wherein the source electrode disposed at a first end portion of the series of transistors is in direct contact with a source interconnect, and
   wherein the drain electrode disposed at a second end portion of the series of transistors is in direct contact with a drain interconnect, and
   wherein a top portion of the hermetic cavity is covered by an insulating cover layer including a plurality of through-holes, and wherein the through-holes are sealed by a plurality of seal plugs so as to form the hermetic cavity.

2. The integrated circuit according to claim 1, wherein the source interconnect, the drain interconnect, and the seal plugs are made of a same material.

3. The integrated circuit according to claim 1, wherein the source interconnect and the drain interconnect are made of tungsten.

4. The integrated circuit according to claim 1, further comprising:
   a metal silicide disposed on top of the source electrode, the drain electrode, and the gate electrode.

5. The integrated circuit according to claim 1, wherein the semiconductor substrate is a monocrystalline silicon substrate.

6. The integrated circuit according to claim 1, wherein the semiconductor substrate is a silicon-on-insulator (SOI) substrate comprising a buried insulating layer, a first substrate disposed above the buried insulating layer, and a second substrate disposed below the buried insulating layer.

7. The integrated circuit according to claim 6, wherein bottom portions of the transistors are spaced apart from the buried insulating layer by a predetermined distance.

8. The integrated circuit according to claim 6, wherein the first substrate and the second substrate are made of single crystal silicon, and the buried insulating layer is made of a silicon-containing dielectric material.

9. The integrated circuit according to claim 8, wherein the buried insulating layer includes at least one of silicon oxide and silicon nitride.

10. The integrated circuit according to claim 1, wherein the semiconductor substrate further includes a bottom dielectric layer.

11. A method of manufacturing an integrated circuit, comprising:
    providing a semiconductor substrate;
    forming at least two transistors connected in series on the semiconductor substrate, wherein each transistor shares a source electrode or a drain electrode with an adjacent transistor;
    forming a sacrificial gate dielectric layer on the source electrode and the drain electrode between adjacent transistors;
    forming an insulating cover layer on the semiconductor substrate covering the sacrificial gate dielectric layer, the gate electrode, the source electrode at a first end portion of the series of transistors, and the drain electrode at a second end portion of the series of transistors;
    forming a plurality of through-holes in the insulating cover layer above the sacrificial gate dielectric layer;
    removing the sacrificial gate dielectric layer via the through-holes so as to form a cavity;
    forming a plurality of seal plugs and sealing the through-holes of the insulating layer using the plurality of seal plugs so as to form a hermetic cavity on the source electrode and the drain electrode between gate electrodes of adjacent transistors; and
    forming a source interconnect extending through the insulating cover layer so as to directly contact the source electrode at the first end portion of the series of transistors, and a drain interconnect extending through the insulating cover layer so as to direct contact the drain electrode at the second end portion of the series of transistors.

12. The method according to claim 11, wherein after the at least two transistors have been formed and prior to forming the sacrificial gate dielectric layer, the method further comprising:
    forming a metal silicide on top of the source electrode, the drain electrode, and the gate electrode.

13. The method according to claim 11, wherein the source interconnect, the drain interconnect, and the seal plugs are made of a same material.

14. A method of manufacturing an integrated circuit, comprising:
- providing a semiconductor substrate;
- forming at least two transistors connected in series on the semiconductor substrate, wherein each transistor shares a source electrode or a drain electrode with an adjacent transistor;
- forming a sacrificial gate dielectric layer on the source electrode and the drain electrode between adjacent transistors;
- forming an insulating cover layer on the semiconductor substrate covering the sacrificial gate dielectric layer, the gate electrode, the source electrode at a first end portion of the series of transistors, and the drain electrode at a second end portion of the series of transistors;
- forming a plurality of through-holes in the insulating cover layer above the sacrificial gate dielectric layer, and forming a first via extending through the insulating cover layer to the source electrode at the first end portion of the series of transistors, and a second via extending through the insulating cover layer to the drain electrode at the second end portion of the series of transistors;
- removing the sacrificial gate dielectric layer via the through-holes so as to form a cavity;
- forming a plurality of seal plugs and sealing the through-holes of the insulating layer using the plurality of seal plugs so as to form a hermetic cavity on the source electrode and the drain electrode between gate electrodes of adjacent transistors; and
- forming a source interconnect in the first via so as to directly contact the source electrode at the first end portion of the series of transistors, and a drain interconnect in the second via so as to directly contact the drain electrode at the second end portion of the series of transistors.

15. The method according to claim 14, wherein after the at least two transistors have been formed and prior to forming the sacrificial gate dielectric layer, the method further comprising:
- forming a metal silicide on top of the source electrode, the drain electrode, and the gate electrode.

16. The method according to claim 14, wherein the source interconnect, the drain interconnect, and the seal plugs are made of a same material.

* * * * *